United States Patent [19]
Cowley et al.

[11] Patent Number: 5,200,650
[45] Date of Patent: Apr. 6, 1993

[54] HIGH FREQUENCY MASTER/SLAVE FLIP-FLOPS

[75] Inventors: Nicholas P. Cowley, Wroughton; Rod Lawton, Swindon, both of United Kingdom; Thomas D. S. McClelland, Lisburn, Northern Ireland

[73] Assignee: Plessey Overseas Limited, Ilford, England

[21] Appl. No.: 616,843

[22] Filed: Nov. 21, 1990

Related U.S. Application Data

[63] Continuation-in-part of Ser. No. 391,536, Jul. 28, 1989.

[30] Foreign Application Priority Data

Nov. 11, 1987 [GB] United Kingdom ................ 8727953

[51] Int. Cl.[5] ................... H03K 3/289; H03K 19/086; H03K 5/13
[52] U.S. Cl. .................................. 307/272.2; 307/289; 307/455; 307/467; 307/269
[58] Field of Search ...................... 307/272.2, 289, 455, 307/467, 269

[56] References Cited

U.S. PATENT DOCUMENTS

| | | | |
|---|---|---|---|
| 4,777,388 | 10/1988 | Widener | 307/272.2 |
| 4,779,009 | 10/1988 | Tsunoi et al. | 307/272.2 |
| 4,825,097 | 4/1989 | Bazil et al. | 307/272.2 |
| 4,970,406 | 11/1990 | Fitzpatrick et al. | 307/272.2 |
| 5,001,361 | 3/1991 | Tamamura et al. | 307/272.2 |

Primary Examiner—Janice A. Howell
Assistant Examiner—Trong Phan
Attorney, Agent, or Firm—Jacobson, Price, Holman & Stern

[57] ABSTRACT

A D-type, master/slave, flip-flop is described for use as a divide-by-2 frequency divider in which a frequency to be divided is input as a clock signal and the $\overline{Q}$ output is connected to the D input, and in which the master section and the slave section consist only of tracking means, latching being effected by using potentials established on tracking transistors of each section during the previous clock pulse.

2 Claims, 2 Drawing Sheets

HIGH FREQUENCY MASTER/SLAVE FLIP-FLOPS

This application is a continuation-in-part of application Ser. No. 07/391,536 filed on Jul. 28, 1989.

Field of the Invention

This invention relates to Master/Slave Flip-Flops, particularly D-Type Flip-Flops, and their use as frequency dividers.

BACKGROUND OF THE INVENTION

A conventional use of D-Type Flip-Flops is in the provision of frequency dividers. The flip-flop is used in the configuration shown in FIG. 1a of the accompanying drawings. As shown, a D-type flip flop 10 has a clock input CK, an input D and outputs Q and $\overline{Q}$. If the $\overline{Q}$ output is fed to the input D, then a signal of frequency $F_0$ e.g. a clock signal, fed to the clock input CK provides an output at the Q output of a signal of frequency $F_0/2$.

To prevent "feed-through", such flip-flops are usually of the "master/slave" type, the "master" being clocked on, for example, a first edge of an input pulse of the input signal, and the "slave" being clocked on a second edge of the input pulse of the input signal.

A single input signal CK may be fed to the input of the master section of the master/slave flip-flop and, through an invertor, to the input of the slave section of the flip-flop. Alternatively, CK and $\overline{CK}$ signals may be fed respectively to clock the master and slave sections of the flip-flop.

FIG. 1b of the accompanying drawings illustrates a known master/slave D-type flip-flop.

In FIG. 1b, it will be seen that a master section A is substantially identical to a slave section B. Like points in the slave section are given the same reference numeral as in the master section but with a prime. Each section comprises a tracking part and a latching part. External connections are available at D, $\overline{D}$, Q and $\overline{Q}$ and enternal (equivalent) points are indicated at at D', $\overline{D}$, Q' and $\overline{Q}'$. Clock input terminals CK and $\overline{CK}$ are also shown and serve to clock respectively, the latch part of master section A and the tracking part of slave section B, and the tracking part of master section A and the latch part of slave section B. Each track part comprises a pair of transistors 12 the ON or OFF state of which is determined firstly by a transistor 14 connecting their emitters to ground via a current sink $I_r$ and secondly by the potential appearing on their bases $\overline{D}$ and D. The transistor 14 is switched on by the clock signal $\overline{CK}$ and the transistor 14' is switched on by the clock signal CK. The two tracking parts thus work in opposite phase. The collectors of transistors 12 are connected to a voltage rail 16 and to the bases D' and D' of the transistors 12'.

Each latch part comprises a pair of transistors 18 having their emitters connected through a transistor switch 20 to the current sink $I_r$. The transistor switch 20 is closed by the application of a pulse to the CK input; the switch 20' being closed by the application of a pulse to the $\overline{CK}$ input.

The bases of a first transistor of the pair 18 is connected to the bases of a second transistor of the pair 12'.

The base of a second transistor of the pair 18 is connected to voltage rail 16 and to the collector of a first transistor of the pair 12.

The base of a first transistor of the pair 18' is connected to voltage rail 16 and to the base of a first transistor of the pair 12. The base of a second transistor of the pair 18' is connected to voltage rail 16 and to the base of the second transistor of the pair 12.

In operation, on receipt of a clock pulse CK, one or the other of the transistor pair 18 will conduct, due initially to imbalance of the circuit, and whatever voltage appears on the collector Q' of the transistor pair 18 (the latch part of the master section) will be tracked by the tracking part of the slave section to base D' of the transistor pair 12'.

On the application of an input to the $\overline{CK}$ input, the first transistor of the pair 12', if it conducts, will provide a "0" output at the Q output of the flip-flop, that is at the collector of the second transistor. Simultaneously, whatever value was present on the collector of the first transistor of the pair 18' in the latch part of the slave section, that is the $\overline{Q}$ output is tracked to the base, the D input, of the second transistor of the transistor pair 12 of the track part of the master section of the flip-flop.

If a signal of frequency $F_0$ is applied to the CK input, and, in antiphase, to the $\overline{CK}$ input, a signal of frequency $F_0/2$ can be taken from the Q output of the flip-flop. Internally of the flip-flop, an input (CK or $\overline{CK}$) is acted on by the track part of one section and the latch part of the other section and transferred, on the next input, to the latch part of the same section and the track part of the other section. In this way, there is no feed through and the resultant output is at half the frequency of the input signal. Two D-type flip-flops connected in series give a divide by four frequency divider and so on.

Whilst it is essential to avoid feedthrough, the tracking and latching parts of each section of the master/slave flip-flop double the number of parts necessary merely to provide the divide by 2 function.

It is an object of the present invention to provide an improved master/slave flip-flop for high frequency operation, wherein, whilst feed through is prevented, separate tracking and latching parts are not necessary.

SUMMARY OF THE INVENTION

According to the present invention, there is provided a master/salve flip-flop comprising a master section and a slave section; each said section comprising:

a pair of tracking transistors; and a switching transistor, said switching transistor serving upon application of a pulse thereto to connect said pair of tracking transistors between a supply voltage and ground;

said master section also including:

a pair of transfer transistors, each said transfer transistor serving to transfer a potential from a respective one of said pair of tracking transistors of said master section to a base of a respective one of said pair of tracking transistors of said slave section;

whereby, in operation, application of a pulse to said switching transistor of said master section energises said pair of tracking transistors of said master section causing potentials to develop on collectors thereof according to inputs applied to bases thereof, and, upon application of a pulse to said switching transistor of said slave section, energises said pair of tracking transistors of said slave section causing said pair of tracking transistors of said slave section to conduct in accordance with the potentials developed on said collectors of said pair of tracking transistors of said master section.

BRIEF DESCRIPTION OF THE DRAWINGS

The invention will be described further, by way of example, with reference to the accompanying drawings, in which.

DETAILED DESCRIPTION OF THE INVENTION

Figure 1:
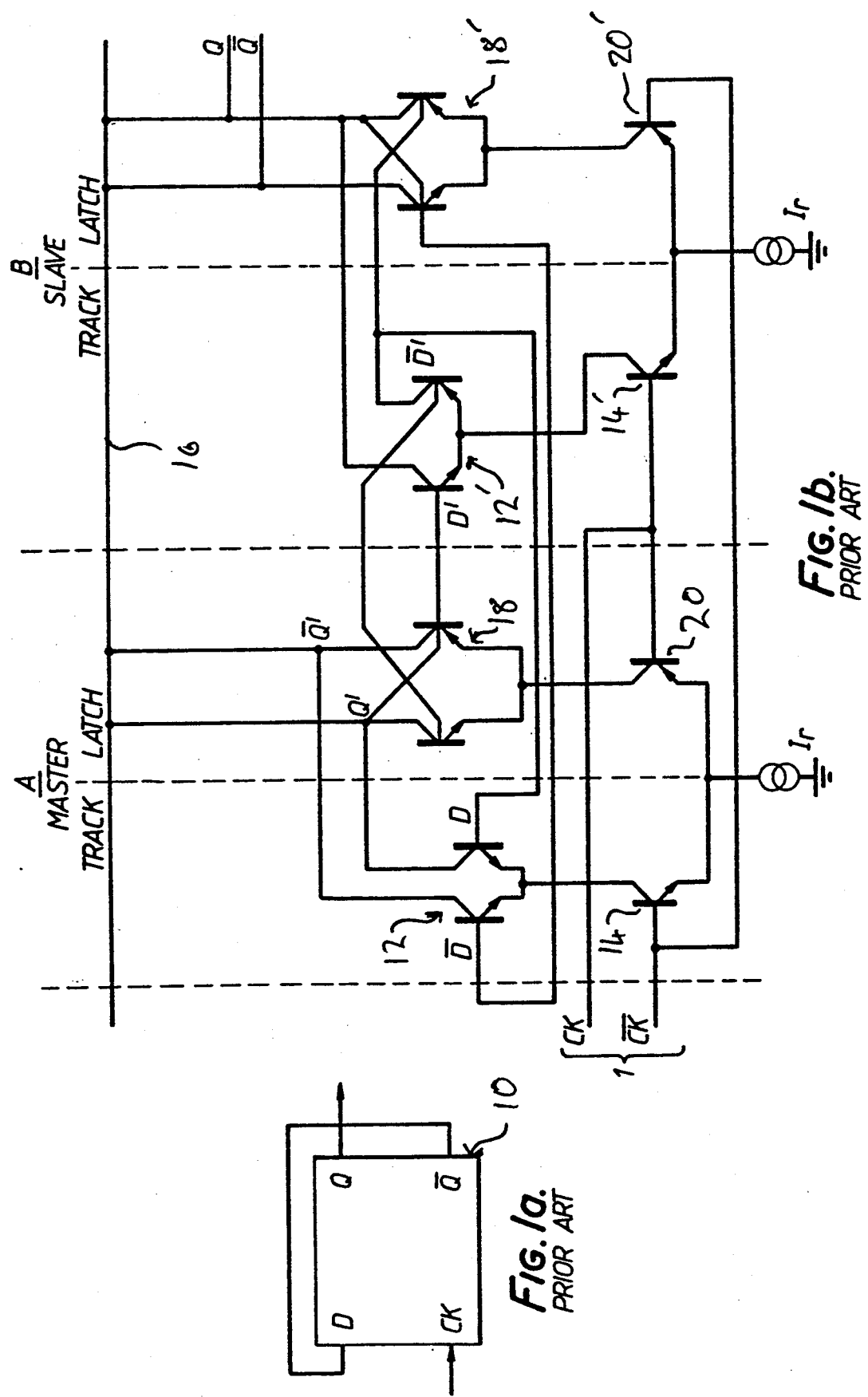
FIGS. 1a and 1b are, as aforesaid, diagrammatic representations of known D-type flip-flops arranged as divide-by-2 frequency dividers.
Figure 2:
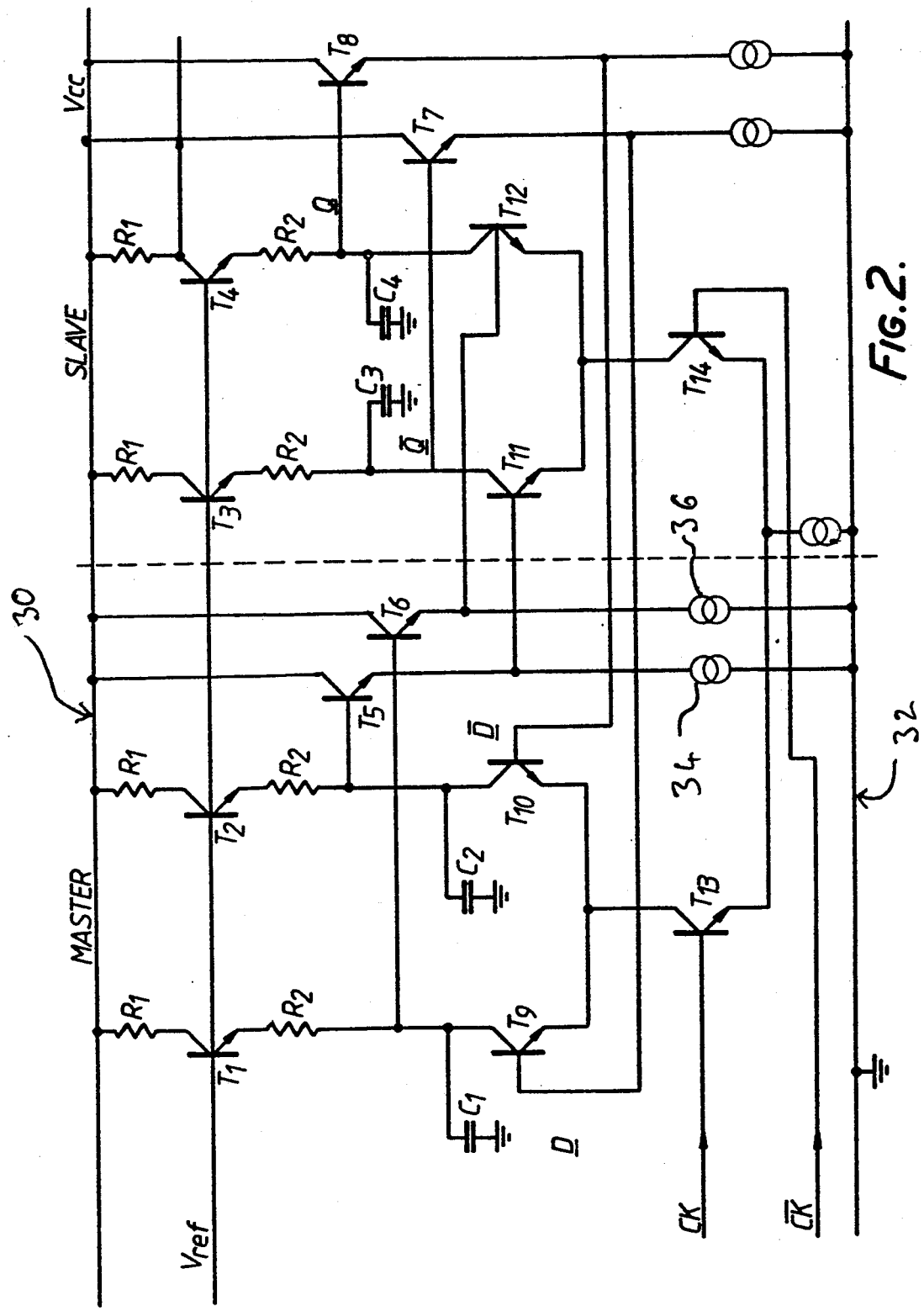
FIG. 2 is a circuit diagram of a master/slave flip-flop, in accordance with the present invention, arranged as a D-type divide-by-2 frequency divider.

Referring to FIG. 2, there is shown a master/slave flip-flop arranged as a D-type divide-by-2 frequency divider. As is conventional with such a flip-flop arrangement a $\overline{Q}$ output serves to drive a D input.

The divider comprises a master section A and a slave section B. Each section is of substantially identical form and only the master section A will be described.

The master section A comrpises a supply rail 30 held at a voltage $V_{cc}$ and a ground rail 32. The voltage $V_{cc}$ is dropped thorugh resistors $R_1$ and $R_2$ and transistor $T_1$ to provide a collector rvoltage for a first transistor $T_9$ of a pair of trackign transistors $T_9$, $T_{10}$. The other transistor $T_{10}$ has its colelctor voltage supply derived from the rail 30 through resistors $R_1$, $R_2$ and transistor $T_2$. Transistors $T_1$ and $T_2$ are energised by the applicaiton of a reference voltage to the bases thereof.

Trackign transsitors $T_9$ and $T_{10}$ have emitters thereof conencted through a switching transistor $T_{13}$ to ground 32. Transistor $T_{13}$ is arranged to be switched on by the applicaiton of a cock pulse CK thereto.

The colelctors of transistors $T_9$ and $T_{10}$ serve respectively to energise the bases of respective transfer transistors $T_6$ and $T_5$. The transistors $T_5$ and $T_6$ are conencted between the supply voltage rail $V_{cc}$ and ground 32 with respective current sinks 34, 36 intheir emitter leads. The emitters of transfer transistors $T_5$ and $T_6$ constitute outputs of the master section A. Bases of the transistors $T_9$ and $T_{10}$ constitute, respectively inputs D and $\overline{D}$ to the master section A. Inherent capacitances denoted as $C_1$ and $C_2$ on the collectors of the transistors $T_9$ and $T_{10}$, respectively, provide remanent voltages, during operation, for actuation of the respective transfer transistors $T_6$ and $T_5$.

The slave section B is identical in construction to that of the master section A. Thus, a pair of tracking transistors $T_{11}$ and $T_{12}$ are switchable connected through a switching transistor $T_{14}$ between ground 32 and the supply rail 30, dropping resistors $R_1$, $R_2$ and transistor $T_3$ supplying the collector voltage to transistor $T_{11}$ and dropping resistors $R_1$, $R_2$ and transistor $T_4$ supplying the collector of transistor $T_{12}$. Switching transistor $T_{14}$ is driven by a clock input $\overline{CK}$, an antiphase signal to the signal CK. Similarly, transfer transistors $T_7$ and $T_8$ are connected between the supply rail 30 and ground 32 and have their bases driven by remanent voltages on the collectors of transistors $T_{11}$ and $T_{12}$ respectively. Inherent capacitors of the collector electrodes of transistors $T_{11}$ and $T_{12}$ denoted respectively as capacitors $C_3$ and $C_4$ provide the voltages for driving the transfer transistors $T_7$ and $T_8$, respectively.

The bases of the transistors $T_{11}$ and $T_{12}$ of the slave section B of the flip-flop are inputs and are supplied by the outputs of the master section A, the emitter$of transfer transistors $T_5$ and $T_6$ respectively. The collectors of the transistors $T_{11}$ and $T_{12}$ of the slave section B constitute the outputs of the flip-flop and are denoted as and $\overline{Q}$ and Q respectively. The emitter outputs of the transfer transistors $T_7$ and $T_8$ of the slave section B are coupled to inputs D and $\overline{D}$, respectively, of the transistors $T_9$ and $T_{10}$ of the master section A.

As shown in FIG. 2, and upon operation, the master section A is powered up on clock pulses CK and the slave section is powered up on clock pulses $\overline{CK}$ (usually the falling edge of the input clock pulse). Each section is arranged only for tracking values through. No latch sections (as in the prior art) are provided. Upon the application of a clock pulse CK, transistor $T_{13}$ is switched on enabling either transistor $T_9$ or $T_{10}$ to be energised depending upon the base potential applied thereto. The base potentials of the transistor $T_9$ and $T_{10}$ are fed via the respective emitters of the transfer transistors $T_7$ and $T_8$ of the slave section B which, in turn, are energised in accordance with remanent charge (during operation) or circuit imbalance (initially) on the collectors of transistors $T_{11}$ and $T_{12}$.

The base of transistor $T_{10}$ is labelled the $\overline{D}$ port of the flip-flop and, for a divide-by-2, is connected in known manner to the Q output of the flip-flop. The Q output is realised by the collector of the transistor $T_{12}$. In operation, the collector of transistor $T_{12}$ will hold thereon a remanent charge tracked thereto during the previous clock pulse $\overline{CK}$. Similarly, the collector of the transistor $T_{11}$ will have an opposite remanent value thereon tracked during the previous clock pulse $\overline{CK}$. These remanent values are dependent upon whether the transistor $T_{11}$ or the transistor $T_{12}$ was switched on which, in turn, depends upon the potential applied to the respective bases. The potential on the bases of transistors $T_{11}$ and $T_{12}$ are dependent upon the emitter voltage of the transfer transistors $T_5$ and $T_6$ of the master section A which, in turn, depend upon remanent charges on the collectors of transistors $T_9$ and $T_{10}$ caused by the voltage thereat during the previously applied clock pulse CK.

The capacitors C1 and C4 are not physical capacitors, they merely idealise the collector capacitance of their respective transistor. It has been found that, at high frequency clock pulse inputs, distinguishable charge levels are held by these idealised capacitances sufficiently long for each tracking section transistor to act also as a latch section transistor without the use of a separate latch section in the master or the slave. Thus, although no capacitors are actually provided, it has been found that the collector capacitance, in the circuit shown, suffices to replace completely, at relatively high frequency inputs, the need for latching sections in the master and the slave. The transfer transistors $T_5$ to $T_8$ enable these small remanent charges to drive the appropriate tracking transistors of the slave section B during the next clock pulse.

The invention is not confined to the precise details of the foregoing example and variations may be made thereto. For instance, depending upon the input frequency, the resistors R1, transistors $T_1$ to $T_4$ and resistors $R_2$ may be replaced by single resistors in the load circuit of the transistors $T_9$ to $T_{12}$.

Similarly, a single clock input CK, followed by an invertor, may be used to provide both CK and $\overline{CK}$ inputs.

In certain circumstances, the transistors $T_5$ to $T_8$ may be replaced by diodes.

In its use as a divide-by-2 divider, it matters not which way the circuit toggles on start up; the input frequency will be divided by two. However, appropriate bias may be provided to ensure that the circuit is driven initially in a predetermined direction.

Other variations are possible within the scope of the present invention as defined in the appended claims.

We claim:

1. A flip-flop comprising a current source; first, second and third pairs of transistors, each transistor of said first, second and third pairs of transistors having an emitter electrode, a base electrode and a collector electrode, a first means connecting the emitter electrodes of said first pair of transistors together and to the collector electrode of one of the third pair of transistors; a second means connecting the emitter electrodes of said second pair of transistors together and to the collector electrode of the other of said third pair of transistors; a third means connecting the emitter electrodes of said third pair of transistors together and to said current source; a fourth means connecting the collector electrodes of said first pair of transistors to respective base electrodes of the second pair of transistors; a fifth means connecting the collector electrodes of said second pair of transistors to respective base electrodes of said first pair of transistors; and means for applying clock signals in antiphase to the base electrodes of said third pair of transistors, whereby, in operation, in each half-cycle of said clock signals a respective one of said first and second pairs of transistors is caused to conduct, and potentials are caused to develop on the collector electrodes of the transistors of said one of said first and second pairs of transistors, in accordance with potentials developed during immediate preceding half-cycle of said clock signals, on the collector electrodes of the transistors of the other of said first and second pairs of transistors.

2. A flip-flop in accordance with claim 1 wherein each of said fourth and fifth means comprises respective transfer transistors connected as emitter followers.

* * * * *